United States Patent [19]

Carl

[11] Patent Number: 5,309,458
[45] Date of Patent: May 3, 1994

[54] METHOD AND APPARATUS FOR STABILIZING LASER DIODE ENERGY OUTPUT

[75] Inventor: James A. Carl, Littleton, Mass.

[73] Assignee: ECRM Trust, Tewksbury, Mass.

[21] Appl. No.: 844,277

[22] Filed: Mar. 2, 1992

[51] Int. Cl.⁵ .............................................. H01S 3/10
[52] U.S. Cl. ...................................... 372/34; 372/31; 372/38
[58] Field of Search ........................ 372/34, 29, 31, 38

[56] References Cited

U.S. PATENT DOCUMENTS 5,018,154  5/1991  Ohashi .................................. 372/34

FOREIGN PATENT DOCUMENTS 0102980  4/1989  Japan .................................... 372/75

Primary Examiner—James W. Davie
Attorney, Agent, or Firm—Hale and Dorr

[57] ABSTRACT

A method and apparatus for maintaining a controlled precise energy output level for a laser diode, particularly useful in a precision scanning environment, provide for a thermal stabilization current to be added to the normal bias exposure current of the diode The thermal stabilization current is modeled to account for the temperature variation of the laser diode junction which affects the light energy output as a function of current. The addition of the thermal stabilization current provides a substantially flat and constant, precise output energy from the laser diode during its "on" time as a function of an input exposure value.

6 Claims, 2 Drawing Sheets

5,309,458

METHOD AND APPARATUS FOR STABILIZING LASER DIODE ENERGY OUTPUT

BACKGROUND OF THE INVENTION

This invention relates generally to stabilizing the light energy output of a laser diode, and more particularly to a method and apparatus for precisely controlling laser diode output energy as the laser is pulsed on and off.

A laser diode is a semiconductor device whose purpose is to provide, as much as possible, coherent light of a specific wavelength and power level. This device has a PN junction similar to any diode device. The differences among semiconductor diodes are in the materials used to create and dope the diode, as well as the PN junction structure. In a laser diode, the junction structure is used to provide a light channel with mirrored ends to produce a resonant cavity for the correct output frequency, that is, for the desired lasing wavelength.

Laser diodes are commonly used in many image scanning applications, and in particular, are used for exposing film or other light sensitive media as the output of the laser diode is scanned across an image line. In a typical application, after each line is scanned, the medium is moved in a direction transverse to the scan direction for sequentially exposing a series of lines on the medium. The result is an image which can be used in any of a number of applications, including, for example, half-tone presentations.

In operation, as in any laser, the electrons are pumped into a higher energy level to produce lasing action. This action creates a population inversion. The pumping action in the laser diode is accomplished by injecting a current into the PN junction; and therefore, for lasing action to occur, the laser diode must be forward biased.

When the laser is forward biased it will emit energy at the appropriate wavelength. However, as the diode begins to heat, the lasing action becomes less efficient, and the emitted power level will decrease in an exponential manner. This decrease in power level is known as "droop" in the industry, and many manufacturers of laser diodes specify this parameter. Thus, since the output of the laser diode varies in accordance with its junction temperature, a laser diode starting "cold" will have a different initial output power for a given input drive current than a laser diode which has recently been used and has a junction starting at an elevated temperature. Thus it is known, that for a selected laser input current, the light energy output decreases with increasing junction temperature.

In a precision laser scanning application, "droop" is of particular significance because it will show up as a tonal variation in the output copy of the image being produced. A known method for dealing with this phenomenon includes maintaining the laser diode at a level of lasing (when it is supposedly "off") that would reduce the droop effect by keeping the junction temperature high. However, this method will not compensate for the total effect and has the added disadvantage of film fogging and/or the requirement of adding a neutral density filter.

Another method controls the actual picture element (pel). This is done by controlling the laser diode for each picture element produced. For high speeds and high precision, this turns out to be a costly approach.

Accordingly, it is an object of the invention to stabilize the laser diode output energy as a function of current input using inexpensive, stable circuit components and without the use of additional filters. Another object of the invention is to compensate for variations in the temperature of the laser diode junction.

SUMMARY OF THE INVENTION

The invention relates to a method and apparatus for maintaining a controlled, precise energy output level from a laser diode. The method of the invention features the steps of applying a switching current to the laser diode, and adding a thermal stabilization current to the switching current. The switching current changes between a first state in which there is no lasing action in the diode and a second state in which there is lasing action in the diode. The thermal stabilization current has a varying value corresponding to the predicted temperature of the diode junction.

In a particular embodiment of the invention, the method further features the steps of increasing a signal for generating the thermal stabilization current in accordance with a first time constant corresponding to a heating rate for the diode junction when the switching current is in the second state, and decreasing the signal in accordance with a second time constant corresponding to a cooling rate for the diode junction when the switching current is in the first state.

The method further features a step of varying a gain to be applied to the thermal stabilization current for matching that current to the diode laser being stabilized, and varying the thermal stabilization current as the value of the switching current varies when it is in the second state.

The apparatus of the invention maintains a controlled precise energy output from the laser diode by providing circuitry for applying a combination of a switching current and a thermal stabilization current to the laser diode. The switching current has a first state in which there is no lasing action in the diode and the second state in which there is lasing action in the diode. The thermal stabilization current has a current value which corresponds to the predicted temperature of the diode junction. In a specific embodiment, the thermal stabilization current is generated through an RC network which has a time constant for increasing the thermal stabilization current, which corresponds to the heating rate for the diode junction when the diode switching current is in the second state. When the diode switching current switches to its first state, the thermal stabilization current generation circuitry provides for a decreasing current signal by allowing a discharge through an RC network which has a time constant corresponding to a cooling rate of the diode junction when the switching current is in the first state. The apparatus of the invention further features circuitry for varying the gain applied to the thermal stabilization current for matching the current to the diode laser being stabilized and for varying the stabilization current when the switching current varies in value during the second mode of operation.

BRIEF DESCRIPTION OF THE DRAWINGS

Other features, objects, and advantages of the invention will appear from the following description of the preferred embodiment, taken together with the drawings in which.

DESCRIPTION OF A PREFERRED EMBODIMENT

Figure 1:
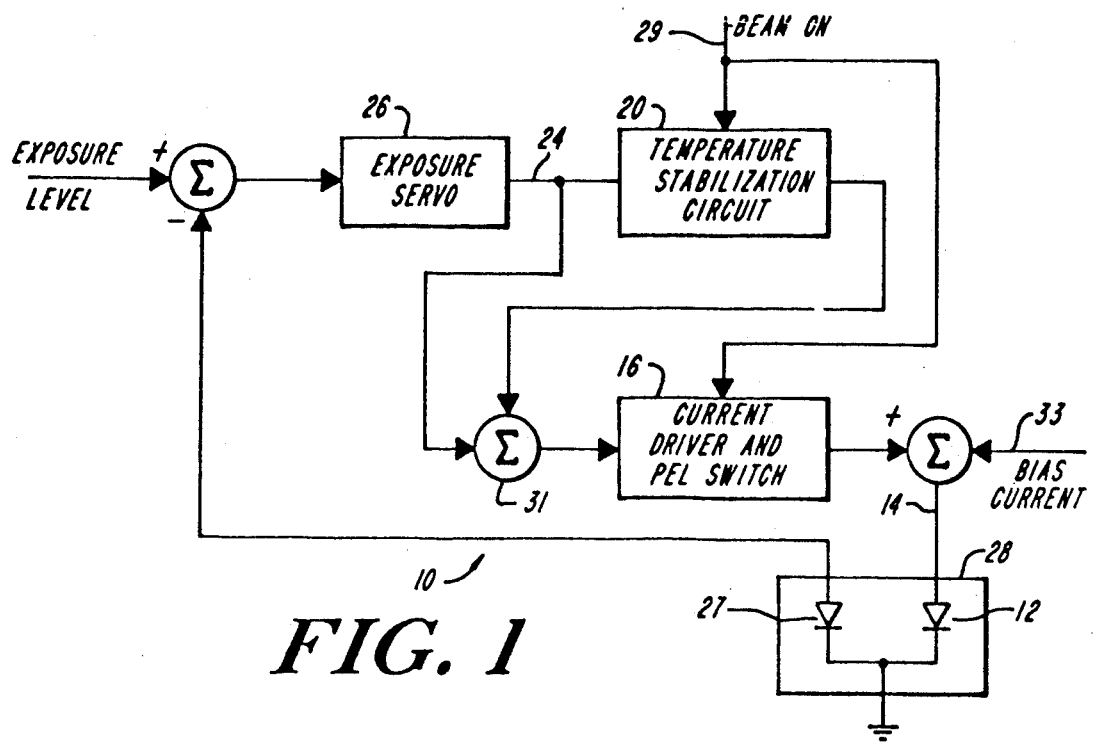
FIG. 1 is a block diagram of the environment in which the laser diode can be used and the circuitry for driving it.

Referring to FIG. 1, a circuitry 10 is employed to control the action of a laser diode 12 as it is used for scanning across the surface of a document. The diode 12 is typically turned on and off (modulated) at intervals determined by an input exposure signal over a line 14. The intervals need not be, and typically are not periodic. Accordingly, the output of the laser diode, if the input current is constant, will vary at initial "turn on", since the droop phenomenon, described above, occurs. This phenomenon, which causes the output to vary as a function of the laser diode junction temperature, can last on the order of 100 or more microseconds, the time in which it takes the laser diode junction to adequately warm to its stable operating temperature. Correspondingly, if the laser diode is "on" for a period of time, and is then turned off and back on again within a very short period of time (for example five microseconds), its light energy output initially will be different than a laser diode which is turned on after being off for a substantial period of time. It is this phenomenon for which the circuitry described herein (in particular, in FIG. 2,) is intended to compensate.

According to the invention, the switching current to the laser diode is generated by a current driver and pel switch circuitry 16 and typically has a time varying binary character. In its "on" state, the current value in line 14 can be, for example, 47 milliamperes, and in its off state, the bias current can be, for example, 33 milliamperes.

In the illustrated embodiment of the invention, the "on" current varies depending upon the film being used. The "on" current provides for lasing action by the laser diode while the off current provides a forward bias for the laser diode just below the lasing threshold. Without further correction, as described hereinafter, the "droop" effect would occur.

Accordingly, a temperature stabilization circuitry 20 is provided which adds a thermal stabilization current over lines 22 to the switching current and thus modifies (adds to) the switching current. As noted above, when the laser diode junction is cold its initial output for a given value of diode drive from circuit 16 is higher than when the junction is warm.

Figure 4:
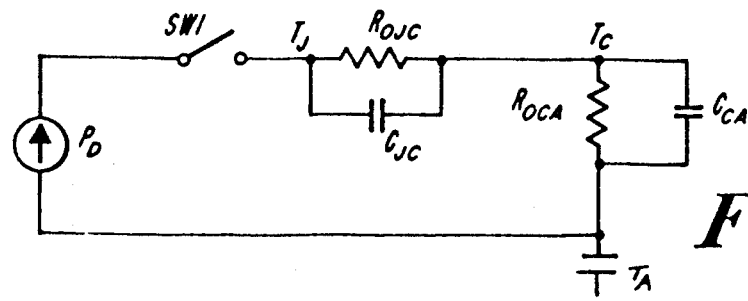
FIG. 4 is a model of the electrical properties of a laser diode.

According to the invention, an approximate thermal model for the laser diode is derived, and from this derivation, pertinent time constants are determined. A temperature stabilization circuit is then synthesized to compensate for the thermal variations. In the model, as illustrated in FIG. 4, the following terms are used:

$P_D$ = Thermal power dissipated by the laser diode.
$T_J$ = Junction temperature.
$T_C$ = Case temperature.
$T_A$ = Ambient temperature.
$R_{OJC}$ = Thermal resistance from junction to case.
$R_{OCA}$ = Thermal resistance from case to ambient.
$C_{JC}$ = Thermal capacitance from junction to case.
$C_{CA}$ = Thermal capacitance from case to ambient.
$SW_1$ = Switch representing the laser diode on and off function.

In addition, the following assumptions are made in describing and simplifying the model:

1. $C_{JC}$ is very small due to the very small mass of the diode itself. This small capacitance will be compensated for by the bias current. Therefore, $C_{JC}$ is set to zero.

2. $R_{OCA}$ takes into account the mounting assembly mass thermal resistance.

3. $C_{CA}$ takes into account the thermal capacitance of the mounting assembly.

4. $T_A$ is assumed to be constant.

According to this model of the diode, two operating conditions must be considered. The first condition is met is when the laser diode is turned on and heats up. This corresponds to closing switch $SW_1$ in FIG. 4. The second condition corresponds to opening switch $SW_1$ and turning the laser diode "off", thus allowing it to cool down.

It has been found that the thermal time constant for the diode heating is given by:

$$T_1 = R_{eq}C_{CA} \text{ where}$$
$$R_{eq} = (R_{OCA} \cdot R_{OJC})/(R_{OJC} + R_{OCA})$$

The thermal time constant for the diode cooling is determined to be:

$$T_2 = R_{OCA}C_{CA}$$

(The derivation of these equations is set forth below in the section entitled "Derivation of Equations A and B".)

This requires two separate time constants to be provided to separately compensate for the heating and cooling modes of operation. The heating time constant is shorter than the cooling time constant, that is, $T_1 < T_2$. The circuit shown in the block diagram of FIG. 2 implements the junction model, and is used to compensate for the thermal effect at the junction. In this circuit $R_{20}$ models $R_{OJC}$, $R_{26}$ models $R_{OCA}$ and $C_{21}$ models $C_{CA}$.

In operation, referring to FIG. 1, the normal exposure level for the laser diode is set by the use of a servo system circuitry 26. The demanded exposure that is required for a specific film is set by the user. The exposure servo circuitry, which has been calibrated to the specific laser, receives a feedback signal over a line from the feedback photodiode 27 that is a part of the laser diode package 28. The level of light output from the laser is then controlled by the servo circuitry to reach the required level for the demanded exposure.

The thermal current stabilization circuit receives and tracks the servoed exposure level to compensate for any variation in laser intensity due to changes in demanded exposure. The /BEAMON command signal, over line 29, is used to turn on the laser diode to produce a picture element. At the same time that /BEAMON is turning on the laser diode, it also closes a switch in the circuit which causes a capacitor $C_{21}$ to be charged through a resistance $R_{20}$.

The time constant $T_1$ for charging the capacitor is given by Equation A above.

The time constant for the circuit after the switch opens as the /BEAMON command signals diode turn off is given by Equation B.

As a result, it has been determined that the addition at summing junction 31 of a current dependent upon the history of laser diode actuation can be used to compensate the diode for energy output changes caused by changes in the temperature of the laser junction. Also, as noted above, a bias current over a line 33, having a value just below the lasing current of the diode, is provided when the current driver 16 is off.

Figure 2:
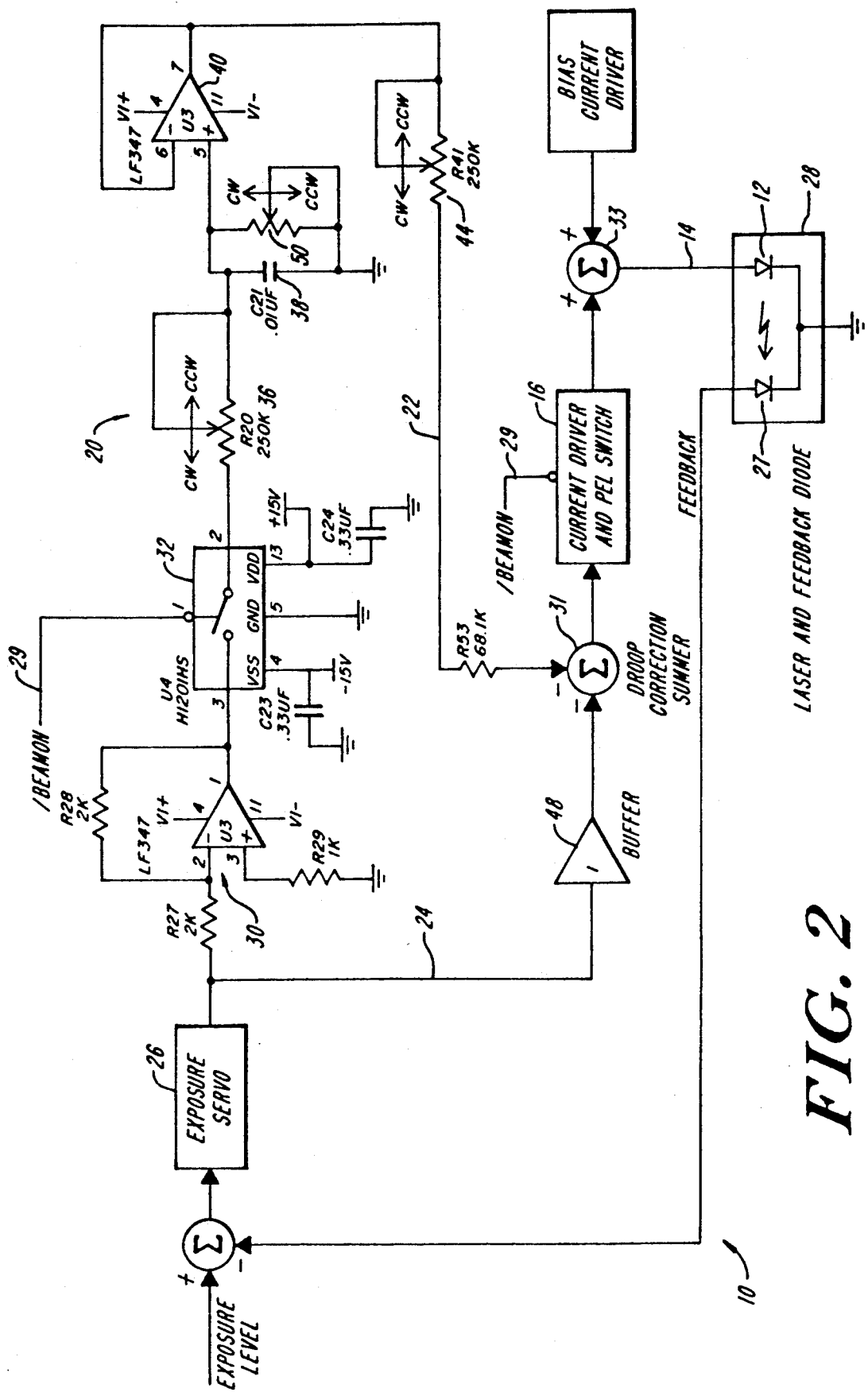
FIG. 2 is a more detailed electrical schematic drawing of particular circuitry for generating the thermal stabilization current added to the switching current for precision laser diode operation.

Referring to FIG. 2, the temperature of the laser junction is in effect determined by the first time constant $T_1$ corresponding to heating of the laser junction by the application of power thereto, and the second time constant $T_2$ which compensates for cooling of the junction when power is removed (except for the non-lasing bias current) from the laser diode. Accordingly, by making use of this information, a thermal stabilization current is created to adjust the current to the laser diode to enable the energy output to be constant independent of the past history of the laser.

Referring to FIG. 2, the exposure signal has a value which varies with the desired energy output from the diode, and is applied to a first amplifier 30 which acts to invert the exposure signal. The output of amplifier 30 passes through a switch element 32 which is actuated whenever the laser beam is turned on. The "beam on" signal (/BEAMON) is provided over a line 29 to control the switch 32. The output of the switch 32 passes through a variable resistor 36 for charging a capacitor 38. Variable resistors 36, 50 and capacitor 38 form an RC circuit having a time constant $T_1$ corresponding to the heatup time constant of the laser diode. Further, the level to which the capacitor charges is dependent upon the "on" exposure signal value. (In one illustrated embodiment of the invention for a SHARP type LTO 27MD laser diode inserted into an aluminum housing where a threaded plug seats the diode base into the housing, thermal contact is made with the laser diode around the edge of its base and along the back of the base by the threaded plug. In this arrangement, $T_1$ equals about 171 microseconds, and $T_2$ equals about 190 microseconds.) The output of the capacitor is buffered through an amplifier 40 whose output passes through a variable resistor 44 and is added to the inverted "normal" exposure to the laser diode 12 at circuit junction 31. The inverted "normal" exposure to the diode is available from an inverting amplifier circuitry 48. (In this embodiment, nominal values of resistors 36 and 50 are 170K and 19K ohms respectively (for a 0.01 microfared capacitor 38).)

Figure 3A:
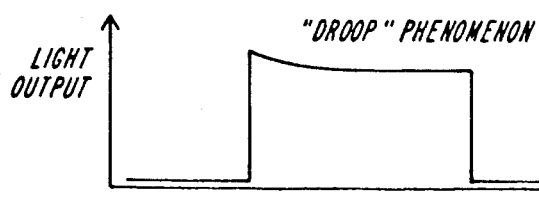
FIG. 3A is a representation of the output of a conventional laser diode.
Figure 3B:
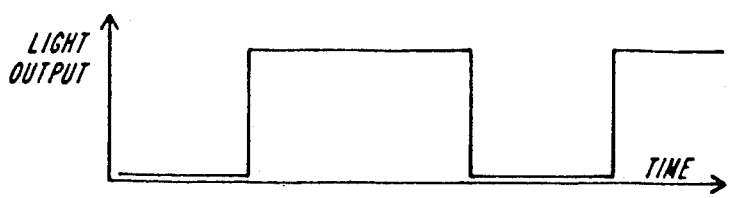
FIG. 3B is a representation of the output of a laser diode compensated in accord with the present invention.

When the beam is turned off, that is, when switch 32 is open, the capacitor discharges through a variable resistor 50. This corresponds to the cooling of the diode junction when current is reduced, and corresponds to the time constant $T_2$. Thus, as the beam is turned on and off (modulated) by the /BEAMON command signal, the capacitor 38 charges and discharges respectively to model the temperature changes at the diode junction. The resulting stabilization current, which has a value proportional to the exposure current "on" value, is added to the normal exposure current for the laser diode, and provides a stable and precise level of output energy from the laser diode. FIG. 3A illustrates a typical laser diode output energy without compensation for the "droop" phenomenon, and FIG. 3B illustrates the same laser diode output pattern with compensation, according to the invention, for the droop phenomenon.

Derivation of Equations A and B

Case 1: Switch Closure

1. $P_D = \dfrac{T_j - T_c}{R_{\theta jc}} + C_{jc} \cdot \dfrac{d}{dt}(T_j - T_c)$ However, $C_{jc}$ is approximately equal to zero. Therefore $$P_D = \dfrac{T_j - T_c}{R_{\theta jc}}$$

2. $P_D = \dfrac{T_c - T_A}{R_{\theta cA}} + C_{cA} \cdot \dfrac{d}{dt}(T_c - T_A)$ Since $T_A = $ constant $\dfrac{d}{dt} T_A = 0$ From equation (1) and (2) we get:

$$C_{cA} \cdot \left(\dfrac{d}{dt} T_c\right) + \dfrac{T_c}{R_{\theta cA}} - \dfrac{T_A}{R_{\theta cA}} = \dfrac{T_j - T_c}{R_{\theta jc}}$$

$$C_{cA} \cdot \left(\dfrac{d}{dt} T_c\right) + T_c \cdot \dfrac{R_{\theta cA} + R_{\theta jc}}{R_{\theta cA} \cdot R_{\theta jc}} = \dfrac{T_j}{R_{\theta jc}} + \dfrac{T_A}{R_{\theta cA}}$$

Let $R_{eq} = \dfrac{R_{\theta cA} \cdot R_{\theta jc}}{R_{\theta cA} + R_{\theta jc}}$ $$\dfrac{d}{dt} T_c + \dfrac{1}{R_{eq} \cdot C_{cA}} \cdot T_c = \dfrac{T_j}{R_{\theta jc} \cdot C_{cA}} + \dfrac{T_A}{R_{\theta cA} \cdot C_{cA}}$$

Solving this 1st order diff. eq. we use the integrating factor $$\mu = e^{\frac{t}{R_{eq} \cdot C_{cA}}}$$

Then $\dfrac{d}{dt} T_c \cdot e^{\frac{t}{R_{eq} \cdot C_{cA}}} = \dfrac{\alpha}{C_{cA}} \cdot e^{\frac{t}{R_{eq} \cdot C_{cA}}}$ Let $\alpha = \dfrac{T_j}{R_{\theta jc}} + \dfrac{T_A}{R_{\theta cA}}$ $$d(T_c \cdot e^{\frac{t}{R_{eq} \cdot C_{cA}}}) = \left(\dfrac{\alpha}{C_{cA}} \cdot e^{\frac{t}{R_{eq} \cdot C_{cA}}}\right) \cdot dt$$

Integrating both sides we get:

$$T_c \cdot e^{\frac{t}{R_{eq} \cdot C_{cA}}} = \alpha \cdot R_{eq} \cdot e^{\frac{t}{R_{eq} \cdot C_{cA}}} + k$$

$$T_c(t) = \alpha \cdot R_{eq} + k \cdot e^{-(\frac{t}{R_{eq} \cdot C_{cA}})}$$

The initial conditions are $T_c(0) = T_A$ $T_c(0) = T_A = \alpha \cdot R_{eq} + k$ or $k = -\alpha \cdot R_{eq} + T_A$ $$T_c(t) = \alpha \cdot R_{eq} + (T_A - \alpha \cdot R_{eq}) \cdot e^{-(\frac{t}{R_{eq} \cdot C_{cA}})}$$

$$\alpha \cdot R_{eq} = \left(\dfrac{T_j}{R_{\theta jc}} + \dfrac{T_A}{R_{\theta cA}}\right) \cdot \dfrac{R_{\theta jc} \cdot R_{\theta cA}}{R_{\theta jc} + R_{\theta cA}}$$

$$\alpha \cdot R_{eq} = \dfrac{T_j \cdot R_{\theta cA} + T_A \cdot R_{\theta jc}}{R_{\theta jc} \cdot R_{\theta cA}}$$

$\tau_{1th} = R_{eq} \cdot C_{cA}$ (These equations apply for switch closure.)

Case 2: Switch Open:

$$0 = \frac{T_c - T_A}{R_{\theta jc}} + C_{cA} \cdot \frac{d}{dt}(T_c - T_A) \text{ Again } \frac{d}{dt} T_A = 0$$

$$C_{cA} \cdot \frac{d}{dt} T_c + \frac{T_c}{R_{\theta cA}} = \frac{T_A}{R_{\theta cA}} \quad \text{Solving this equation we get:}$$

$$T_c(t) = T_A + k \cdot e^{-(\frac{t}{R_{\theta cA} \cdot C_{cA}})}$$

The initial condition is $T_c(t_o) = T_a$ Where $T_A < T_a < T_{max}$ where $T_{max}$ is the steady state temperature achieved with switch $SW1$ closed for a long period. At $t = t_o$ we have $$T_c(t_o) = T_a = T_A + k \cdot e^{-(\frac{t_o}{R_{\theta cA} \cdot C_{cA}})} \text{ or}$$

$$k = (T_a - T_A) \cdot e^{-(\frac{t_o}{R_{\theta cA} \cdot C_{cA}})} \text{ then}$$

$$T_c(t) = T_A + (T_a - T_A) \cdot e^{-(\frac{t_o - t}{R_{\theta cA} \cdot C_{cA}})} \text{ which is valid only}$$
after switch $SW1$ has been opened.

The thermal time constant for this condition is: $\tau_{2th} = R_{\theta cA} \cdot C_{cA}$ Since $R_{\theta cA} > \frac{R_{\theta jc} \cdot R_{\theta cA}}{R_{\theta cA} + R_{\theta jc}}$ we have $\tau_{2th} > \tau_{1th}$.

Therefore there are two time constants to deal with.

Additions, subtractions, deletions and other modifications of the disclosed and illustrated embodiment of the invention will be apparent to those skilled in the art and are within the scope of the following claims.

What is claimed is:

1. A method for maintaining a controlled precise energy output level from a laser diode having a laser diode junction, comprising the steps of:
   applying a switching current to said laser diode, said switching current switching between a first state in which there is no lasing action in the diode, and a second state in which there is lasing action in the diode; and
   adding to said switching current a thermal stabilization current having a value corresponding to the temperature of the diode junction by
   increasing a signal for generating said thermal stabilization current in accordance with a first time constant corresponding to a heating rate of said diode junction when said diode switching current is in said second state, and
   decreasing said signal in accordance with a second time constant corresponding to a cooling rate for said diode junction when said switching current is in said first state.

2. The method of claim 1 wherein said adding step further comprises the step of varying the gain applied to said thermal stabilization current for matching characteristics of said laser diode being stabilized.

3. The method of claim 1 further comprising the step of varying said thermal stabilization current in accordance with a laser diode exposure value.

4. An apparatus for maintaining a controlled precise energy output level from a laser diode having a laser diode junction comprising:
   means for applying a switching current to said laser diode, said switching current switching between a first state in which there is no lasing action in the diode and a second state in which there is lasing action in the diode, and
   means for adding to said switching current a thermal stabilization current having a value corresponding to the temperature of the diode junction, said adding means including
   means for increasing a signal for generating said stabilization current in accordance with a first time constant corresponding to a heating rate of said diode junction when said diode switching current is in said second state, and
   means for decreasing said signal in accordance with a second time constant corresponding to a cooling rate for said diode junction when said switching current is in said first state.

5. The apparatus of claim 4 wherein said adding means further comprises
   means for varying a gain applied to said thermal stabilization current for matching said stabilization current to said diode laser being stabilized.

6. The apparatus of claim 4 further comprising
   means for varying the thermal stabilization current in accordance with a laser diode exposure value.

* * * * *